(12) United States Patent
Fujiwara

(10) Patent No.: US 7,589,402 B2
(45) Date of Patent: Sep. 15, 2009

(54) SEMICONDUCTOR MODULE AND MANUFACTURING METHOD THEREOF

(75) Inventor: Seiji Fujiwara, Kadoma (JP)

(73) Assignee: Panasonic Corporation, Osaka (JP)

( * ) Notice: Subject to any disclaimer, the term of this patent is extended or adjusted under 35 U.S.C. 154(b) by 33 days.

(21) Appl. No.: 11/594,098

(22) Filed: Nov. 8, 2006

(65) Prior Publication Data

US 2007/0126117 A1    Jun. 7, 2007

(30) Foreign Application Priority Data

Dec. 1, 2005    (JP)    ............................. 2005-347386

(51) Int. Cl.
 *H01L 23/495*    (2006.01)
(52) U.S. Cl. ...................... 257/675; 257/706
(58) Field of Classification Search ................. 257/723, 257/699, 675, 705, 706, 712, 718, 733
See application file for complete search history.

(56) References Cited

U.S. PATENT DOCUMENTS

| 5,198,964 | A | * | 3/1993 | Ito et al. ...................... 361/717 |
| 5,355,283 | A | * | 10/1994 | Marrs et al. .................. 361/760 |
| 6,541,854 | B2 | * | 4/2003 | Huang et al. ................. 257/707 |
| 6,576,888 | B2 | * | 6/2003 | Fujimura et al. ....... 250/227.11 |
| 6,949,823 | B2 | * | 9/2005 | Schott et al. ................. 257/707 |
| 7,061,100 | B2 | * | 6/2006 | Iwaki et al. .................. 257/706 |
| 2004/0070948 | A1 | * | 4/2004 | Kao et al. ..................... 361/717 |
| 2004/0164404 | A1 | * | 8/2004 | Huang ......................... 257/706 |
| 2005/0048759 | A1 | * | 3/2005 | Hsu .............................. 438/618 |
| 2006/0017145 | A1 | * | 1/2006 | Lin et al. ..................... 257/684 |
| 2006/0067054 | A1 | * | 3/2006 | Wang et al. .................. 361/704 |

FOREIGN PATENT DOCUMENTS

| CN | 2558078 Y | 6/2003 |
| JP | 2002-334811 | 11/2002 |
| JP | 2003-347444 | 12/2003 |

* cited by examiner

*Primary Examiner*—Wai-Sing Louie
*Assistant Examiner*—Bilkis Jahan
(74) *Attorney, Agent, or Firm*—Steptoe & Johnson LLP

(57) ABSTRACT

A center of a substrate having peripheral circuit components mounted thereon is hollowed in a size maintaining a distance for establishing a connection with a semiconductor chip through a conductor such that the semiconductor chip is bonded to a heatsink and the peripheral circuit components are arranged near the semiconductor chip so as to surround the semiconductor chip. Upon adhesion of a conductive paste material, for bonding the substrate to the heatsink having the semiconductor chip mounted thereon in a conductive manner, to a bottom face of the substrate, an adhesive tape is stuck to an edge of the substrate so as to prevent outflow of the conductive paste material, respective terminals are connected through conductors, and both the substrate and the heatsink are sealed with a resin.

16 Claims, 7 Drawing Sheets

FIG. 4
PRIOR ART
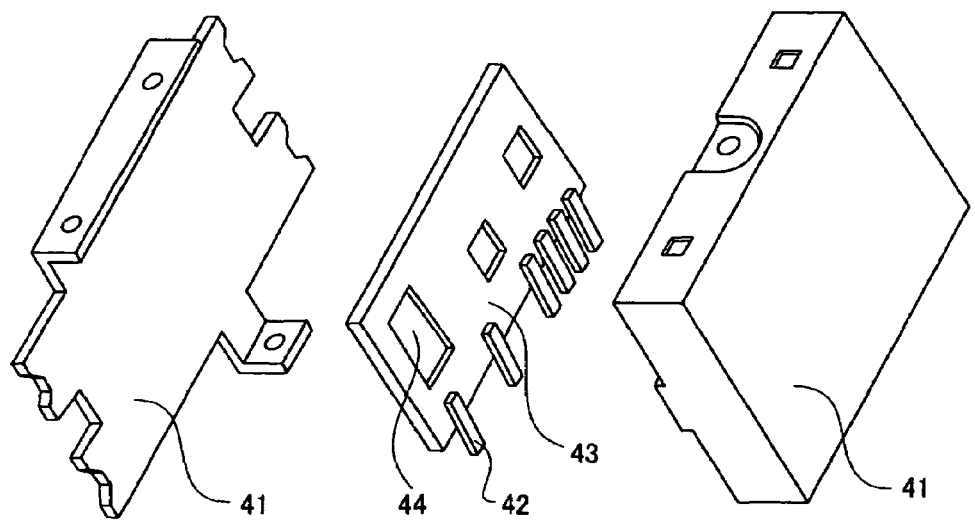
FIG. 5A
PRIOR ART
FIG. 5B
PRIOR ART
FIG. 5C
PRIOR ART
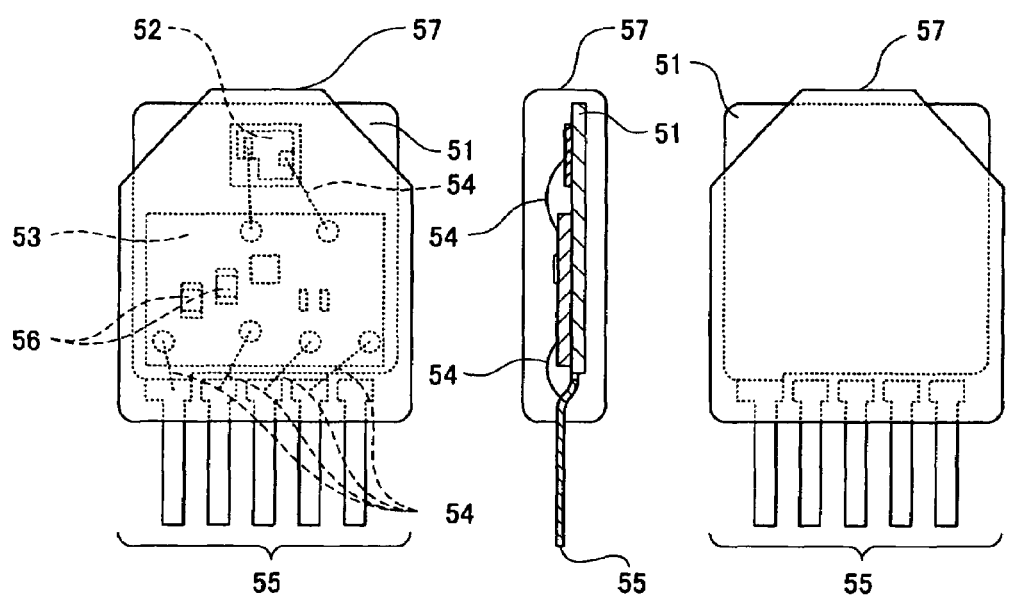

FIG. 6A
FIG. 6B
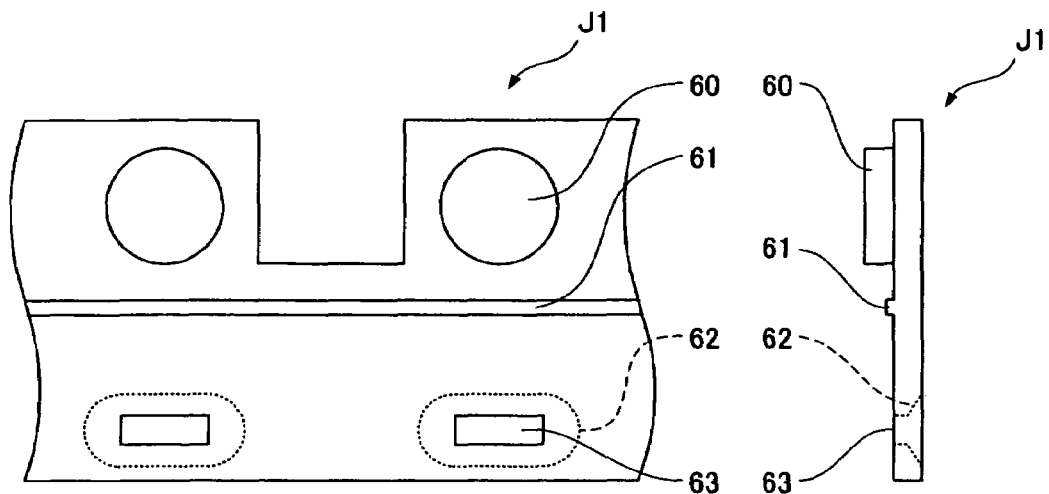
FIG. 6C
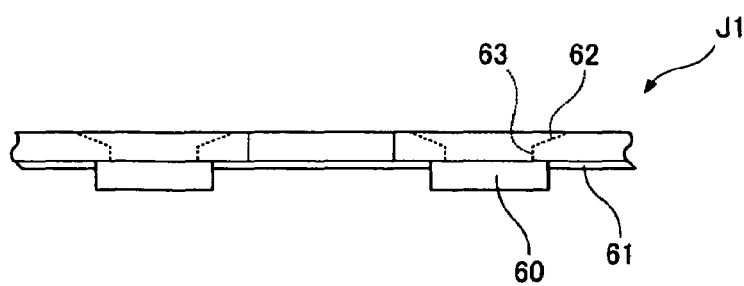

SEMICONDUCTOR MODULE AND MANUFACTURING METHOD THEREOF

BACKGROUND OF THE INVENTION (1) Field of the Invention

The present invention relates to a semiconductor module and a manufacturing method thereof. This semiconductor module is obtained as follows: a semiconductor chip requiring a heatsinking property and a peripheral circuit component having the heatsinking property, each mounted on a substrate, are sealed with a resin as one package.

(2) Description of the Related Art

Generally, it is very important to improve a heatsinking property in regard to heat generated upon operation of a semiconductor chip. In order to improve the heatsinking property, a material having good thermal conductivity is used for reducing an adverse influence of the heat generated from the semiconductor chip. A product including a substrate and a package each made of metal has a good heatsinking property. However, a semiconductor module, wherein a semiconductor chip or a semiconductor package and a surface mount component are mounted on a single substrate, has a limitation in configuration because of an increase in cost of materials for constituent elements. A resin substrate or a ceramic substrate to be used for achieving cost reduction is inferior in heatsinking property to a metal substrate.

In order to effectively exert a heatsinking property, it is necessary to bring a heat generating part into close contact with a metal plate and, then, to form circuit components around the heat generating part. Otherwise, it is impossible to obtain a predetermined heatsinking property.

For example, JP2003-347444A (hereinafter, referred to as "conventional example 1") discloses a semiconductor module releasing heat generated from a semiconductor chip out of a metal case to thereby suppress a temperature of the semiconductor chip within an operating temperature range. Further, JP2002-334811A (hereinafter, referred to as "conventional example 2") discloses a technique for bringing a semiconductor chip generating heat into close contact with a metal plate.

However, the technique in the conventional example 1 has a disadvantage that a semiconductor module to be obtained is very expensive and a method for manufacturing the semiconductor module becomes complicated. On the other hand, according to the technique in the conventional example 2, a semiconductor chip generating heat is bonded to a metal plate; thus, a semiconductor module with high heatsinking property can be obtained at low cost. However, such a semiconductor chip must be joined to plural peripheral circuit components; therefore, a layout for joining between chip components of a circuit and the semiconductor chip becomes important. Consequently, there arise problems that a long conductor to be used herein inhibits achievement in predetermined property (particularly, high-frequency property), and intersection of conductors leads to restraint in a manufacturing method of a semiconductor module.

SUMMARY OF THE INVENTION

The present invention is made to solve the aforementioned conventional problems and an object thereof is to provide a semiconductor module and a manufacturing method thereof. According to the present invention, even in a case that a semiconductor bare chip requiring a heatsinking property must be adjoined to peripheral circuit components in view of electrical properties, a small-size semiconductor module having a good heatsinking property and a high-frequency property can be realized by a stable manufacturing method at low cost while sufficiently maintaining its reliability as a product.

The present invention provides a semiconductor module obtained by sealing a substrate having a semiconductor chip requiring a heatsinking property and peripheral circuit components each having the heatsinking property mounted thereon with a resin as one package, wherein a center of a peripheral circuit component mount face of the substrate is hollowed into a size maintaining a distance for establishing a connection with the semiconductor chip through a conductor such that the substrate is bonded through an adhesive to a heatsink for releasing heat generated from the semiconductor chip and the peripheral circuit components are arranged to surround the semiconductor chip in proximity thereto.

The present invention also provides a manufacturing method of the semiconductor module, wherein a chip positioning jig performing positioning of the semiconductor chip and withstanding a thermal bonding process is used when the semiconductor chip is fixedly bonded to a predetermined position of the heatsink.

The present invention also provides a manufacturing method of the semiconductor module, wherein the substrate is bonded to the heatsink at a temperature lower than a temperature condition in a mounting process for the substrate having the semiconductor chip and the peripheral circuit components mounted thereon.

According to the present invention, as described above, the following effects can be achieved. That is, it is possible to suppress deterioration in high-frequency property due to a connection between a semiconductor chip and peripheral circuit components each allowing the semiconductor chip to operate, and to facilitate setting of a constant. Further, in a case that a semiconductor chip is bonded to a heatsink in a manufacturing process of a semiconductor module, it is possible to perform the bonding without outflow of a conductive material from a substrate and generation of a clearance.

Thus, according to the present invention, even in a case that a semiconductor bare chip requiring a heatsinking property must be adjoined to peripheral circuit components in view of electrical properties, a small-size semiconductor module having a good heatsinking property and a high-frequency property can be realized by a stable manufacturing method at low cost while sufficiently maintaining its reliability as a product.

BRIEF DESCRIPTION OF THE DRAWINGS

FIG. 4 is a perspective view illustrating an internal appearance and an external appearance of a semiconductor module in a conventional example 1;

FIG. 5A is a transparent front view illustrating a semiconductor module in a conventional example 2;

FIG. 5B is a sectional side view illustrating the semiconductor module in the conventional example 2;

FIG. 5C is a transparent rear view illustrating the semiconductor module in the conventional example 2;

FIG. 6A is a front view illustrating a semiconductor chip mounting jig used in a manufacturing method of the semiconductor module according to the embodiment;

FIG. 6B is a side view illustrating the semiconductor chip mounting jig used in the manufacturing method of the semiconductor module according to the embodiment;

FIG. 6C is a top view illustrating the semiconductor chip mounting jig used in the manufacturing method of the semiconductor module according to the embodiment;

DESCRIPTION OF THE PREFERRED EMBODIMENT

Hereinafter, specific description will be given of a semiconductor module according to an embodiment of the present invention and a manufacturing method thereof with reference to the drawings.

Figure 1A:
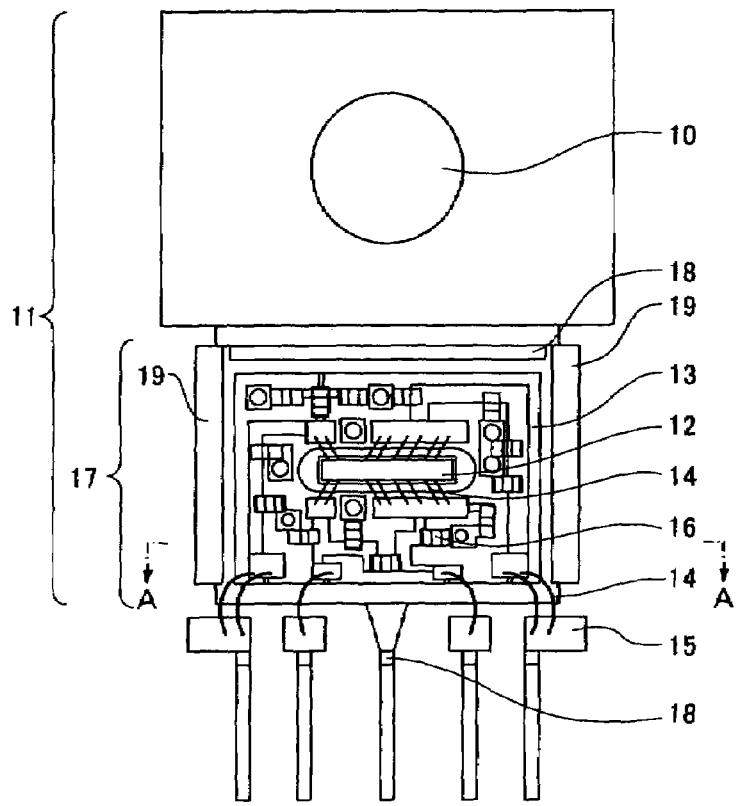
FIG. 1A is an internal front view illustrating a semiconductor module according to an embodiment of the present invention.
Figure 1B:
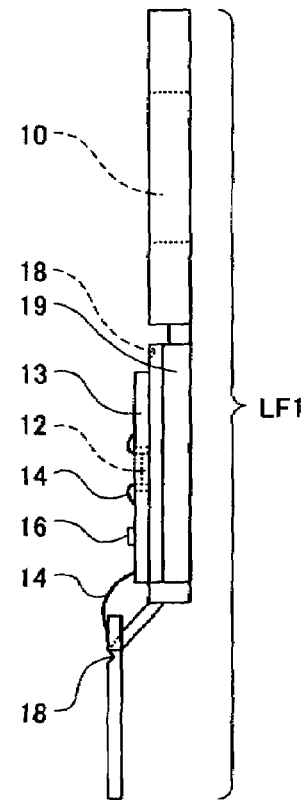
FIG. 1B is an internal side view illustrating the semiconductor module according to the embodiment.
Figure 1C:
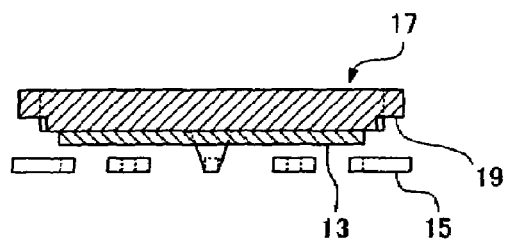
FIG. 1C is a sectional view illustrating the semiconductor module according to the embodiment.
Figures 2A, 2B:
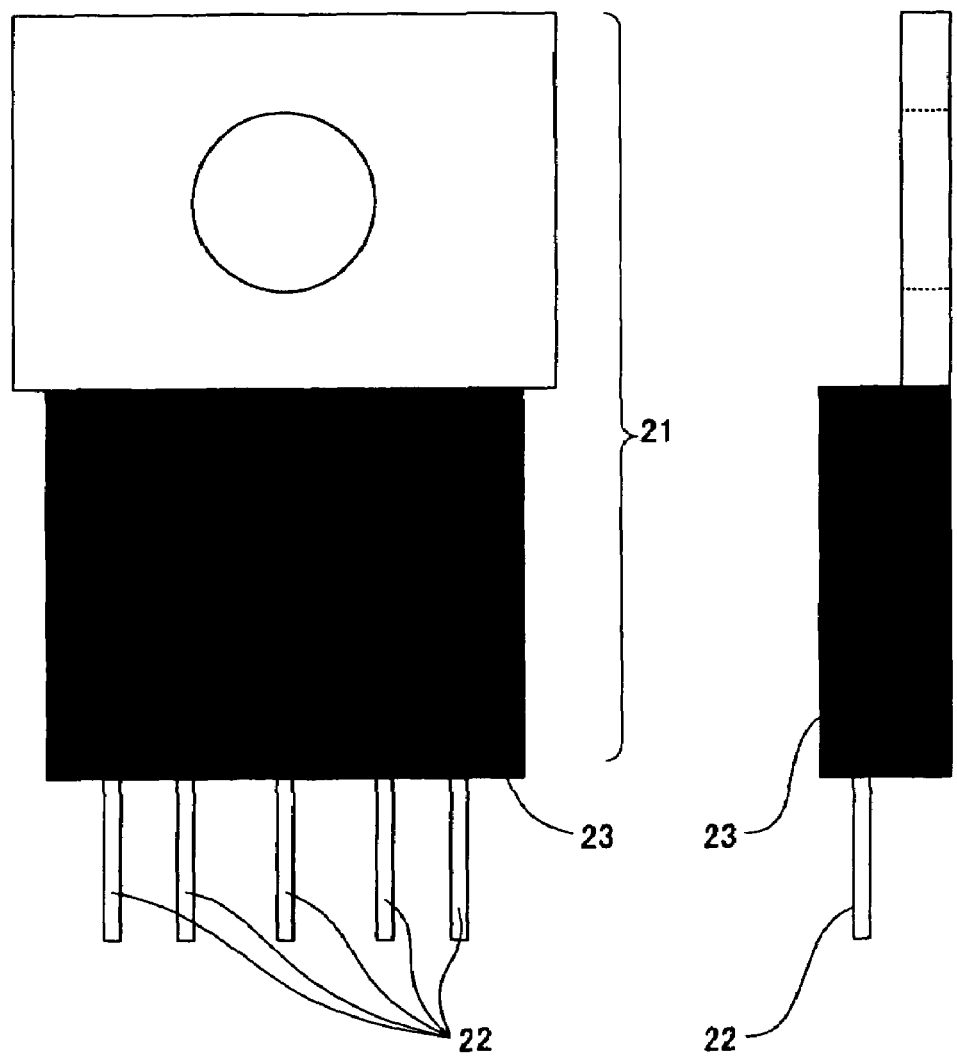
FIG. 2A is an external front view illustrating the semiconductor module according to the embodiment.
FIG. 2B is an external side view illustrating the semiconductor module according to the embodiment.
Figure 3A:
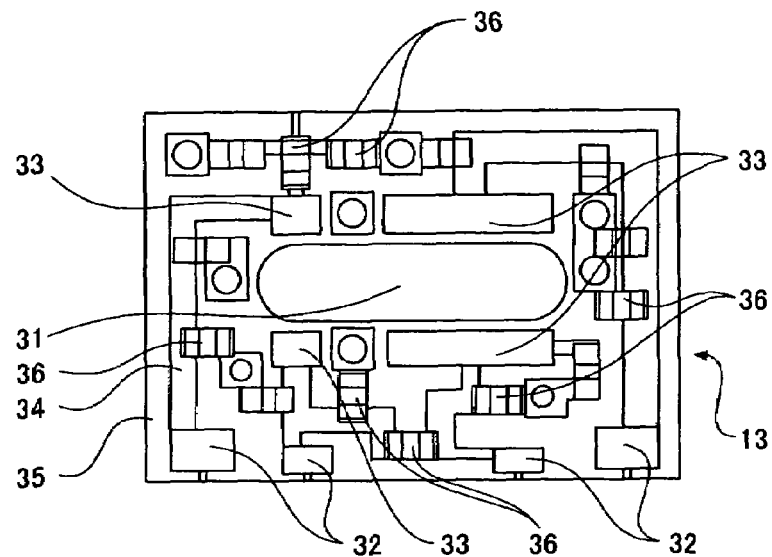
FIG. 3A is a plan view illustrating a top face of a circuit board in the semiconductor module according to the embodiment.
Figure 3B:
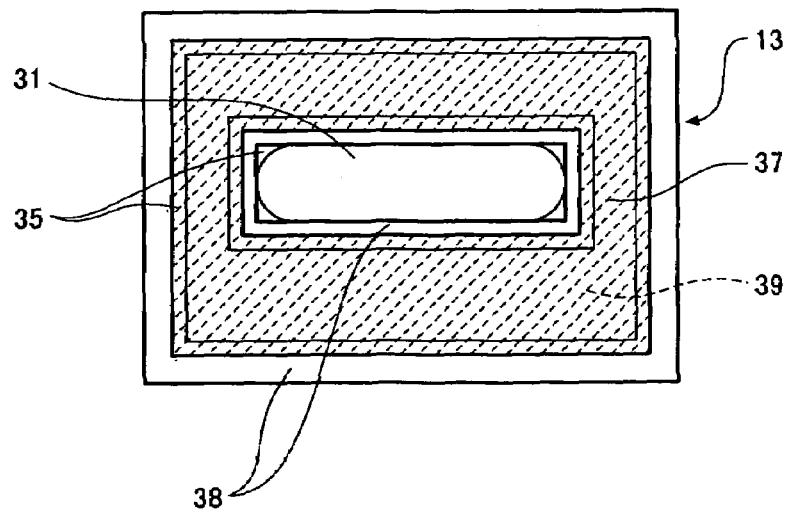
FIG. 3B is a plan view illustrating a bottom face of the circuit board in the semiconductor module according to the embodiment.

FIG. 1A is an internal front view illustrating the semiconductor module according to the embodiment. FIG. 1B is an internal side view illustrating the semiconductor module according to the embodiment. FIG. 1C is a sectional view taken along a line A-A in FIG. 1A. FIG. 2A is an external front view illustrating the semiconductor module according to the embodiment. FIG. 2B is an external side view illustrating the semiconductor module according to the embodiment. FIG. 3A is a plan view illustrating a top face of a circuit board in the semiconductor module according to the embodiment. FIG. 3B is a plan view illustrating a bottom face of the circuit board in the semiconductor module according to the embodiment. As illustrated in FIGS. 1A, 1B, 1C, 2A, 2B, 3A and 3B, the semiconductor module according to the embodiment includes the following components.

A lead frame LF1 including a heatsink 11 having a thickness of about 1.4 mm and lead terminals each formed into a different shape and made of a Cu material is subjected to Ni plating in a thickness of about 2 μm. Further, only a die pad 17 where a semiconductor chip 12 is connected to a substrate 13 through Au wires 14 is subjected to Ag plating in a thickness of about 4 μm. The semiconductor chip 12 has a bottom face subjected to Au/Sn deposition in a thickness of about 20 μm, and is thermally bonded to the die pad 17 of the heatsink 11.

Upon performance of this thermal bonding, the semiconductor chip 12 must be located at a predetermined position on the die pad 17. This positioning of the semiconductor chip 12 on the die pad 17 exerts an influence on a subsequent positional relation between the semiconductor chip 12 and the glass epoxy substrate 13 and, therefore, is very important. As illustrated in FIGS. 6A (a front view), 6B (a side view) and 6C (a top view), a semiconductor chip mounting jig J1 fitting to a shape of the lead frame LF1 is used for this positioning.

As illustrated in FIGS. 6A to 6C, in order to hold the semiconductor chip 12 until fixation onto the die pad 17 of the heatsink 11 by means of Au/Sn deposition, the semiconductor chip mounting jig J1 includes positioning protrusions 60, a positioning convex 61, semiconductor chip inserting slots 62 and semiconductor chip fixing slots 63. Herein, the positioning protrusion 60 is formed into a cylindrical shape so as to fit into a recess 10 of the heatsink 11 upon positioning of the heatsink 11. The positioning convex 61 is used for performing positioning of the heatsink 11 with respect to the die pad 17. The semiconductor chip inserting slot 62 and the semiconductor chip fixing slot 63 are used for performing positioning of the semiconductor chip 12 when the semiconductor chip 12 is thermally bonded onto the die pad 17. The semiconductor chip mounting jig J1 is made of a material capable of sufficiently withstanding thermal stress and mechanical stress each applied due to thermal bonding for fixation of the semiconductor chip 12 onto the die pad 17 of the heatsink 11.

Figure 7A:
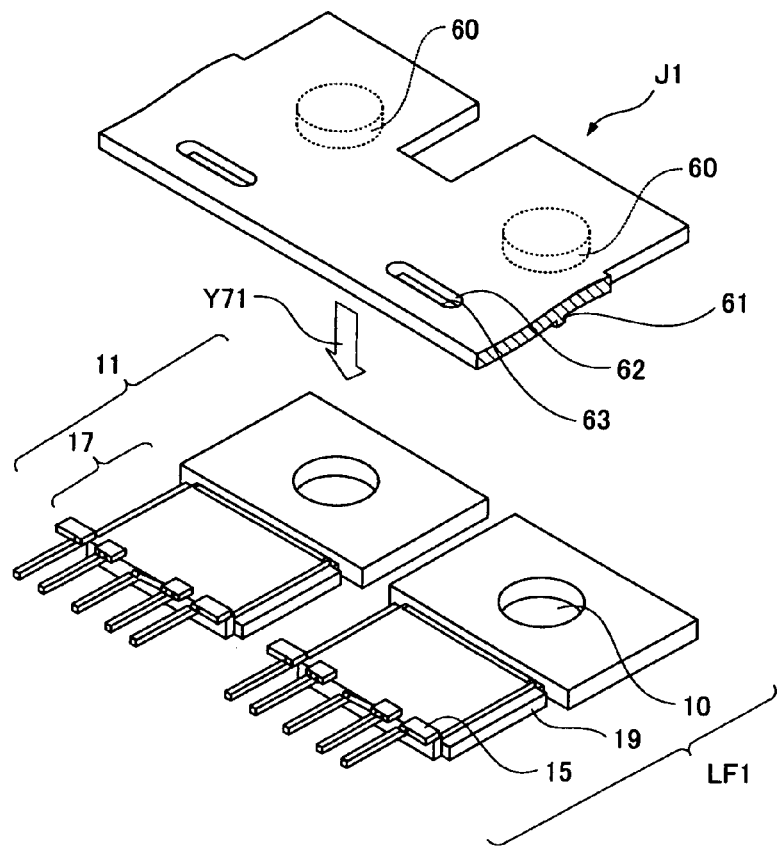
FIG. 7A is a perspective view illustrating a process 1 for performing die bonding on a semiconductor chip in the manufacturing method of the semiconductor module according to the embodiment.
Figure 7B:
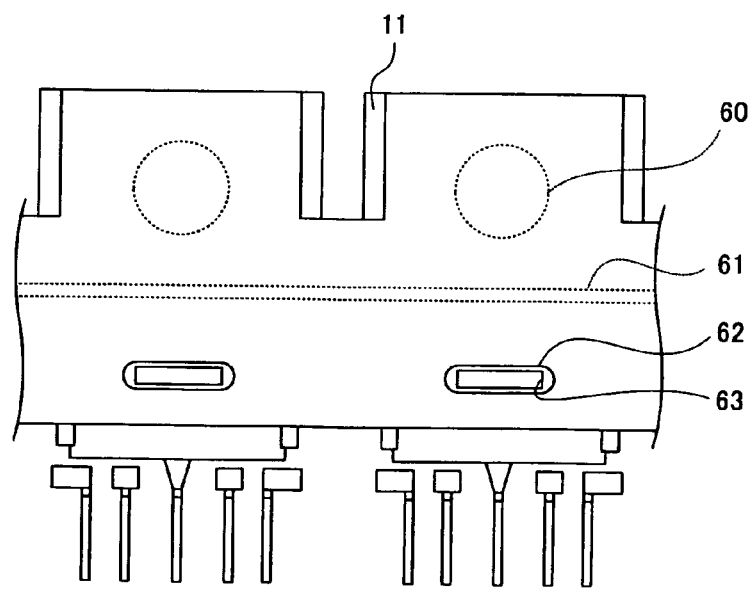
FIG. 7B is a front view illustrating a process 2 for performing die bonding on a semiconductor chip in the manufacturing method of the semiconductor module according to the embodiment.

In order to thermally bond the semiconductor chip 12 onto the die pad 17 through use of the semiconductor chip mounting jig J1 illustrated in FIGS. 6A to 6C, the recess 10 of the heatsink 11 is subjected to positioning by the positioning protrusion 60 and, also, the die pad 17 is subjected to positioning by the positioning convex 61 in a state illustrated in FIG. 7A (a perspective view). Then, the semiconductor chip 12 is inserted into the semiconductor chip inserting slot 62 and the semiconductor chip fixing slot 63 in a direction of an arrow Y71 in FIG. 7A in a state that the semiconductor chip 12 is previously placed on the heatsink 11 as illustrated in FIG. 7B (a front view). Herein, in order to facilitate this insertion, the semiconductor chip mounting jig J1 has the following configuration: the semiconductor chip inserting slot 62 has a size sufficiently larger than an outer periphery of the semiconductor chip 12 and the semiconductor chip fixing slot 63 located near a die bonding area on the die pad 17 has a size slightly larger than the outer periphery of the semiconductor chip 12 such that the semiconductor chip fixing slot 63 is smaller in size than the semiconductor chip inserting slot 62.

The substrate 13 is made of a glass epoxy material containing 96% of alumina in a thickness of about 300 μm, and a hollow 31 having a size larger by about 200 μm than that of the semiconductor chip 12 is provided near a center of the substrate 13. On a top face of the substrate 13, electric wiring is selectively carried out by a resist layer 35 having a thickness of about 15 μm. In the substrate 13, electric wiring is carried out by a Cu plate 34 having a thickness of about 18 μm. On a bottom face of the substrate 13, a Cu plate 37 is formed so as to stabilize a potential at the bottom face. To the top face of the substrate 13, surface mount components 16 (36 in FIG. 3A) such as chip capacitors and chip resistors are electrically connected by means of Sn/Ag/Cu soldering on a predetermined pattern.

Upon bonding of the substrate 13 formed as described above to the die pad 17 of the heatsink 11, in order to connect the Cu plate 37 on the bottom face of the substrate 13 to the heatsink 11, an Ag paste 39, capable of achieving an electrical connection at a low temperature of about 170° C., or the like is applied onto a predetermined position of the heatsink 11 through use of a dispenser or the like. In this case, dams are formed around a region where the semiconductor chip 12 is placed, in such a manner that adhesive tapes 38 each having a thickness of about 10 μm are stuck to inner and outer peripheries of the bottom face of the substrate 13 so as to rim the inner and outer peripheries in order to prevent outflow of the connection material such as the Ag paste 39. Alternatively, grooves each having a depth of about 50 μm are formed in the heatsink 11 and the glass epoxy substrate 13 at positions corresponding to the aforementioned dams.

Au wires 14 each having a diameter of about 28 μm electrically connect between electrodes of the semiconductor chip 12 and circuit board terminals 33 on the substrate 13. Similarly, Au wires 14 each having a diameter of about 28 μm electrically connect between inner lead terminals 15 and circuit board terminals 32 on the substrate 13. In order to hold and protect outer lead terminals 33, the semiconductor chip 12 and the substrate 13, a seal 23 made of an epoxy resin is formed in a package molding manner so as to cover the die pad 17 of the heatsink 11.

A "V"-shaped groove 18 in each inner lead terminal 15 and a coining portion 19 in the die pad 17 are formed to improve adhesiveness between the die pad 17 and the inner lead terminal 15 each made of metal and the seal 23 made of an epoxy resin. As illustrated in FIGS. 1B and 1C, formation of the "V"-shaped groove 18 and the coining portion 19, that is, formation of physical irregularities is expected to achieve an intentional anchor effect.

Herein, description will be given of the technique in the conventional example 1 again with reference to FIG. 4.

Semiconductor circuit elements and passive circuit elements are mounted on a circuit board 43, and lead terminals 42 are connected to terminal attachment portions of the circuit board 43. The circuit board 43 is covered with a metal case 41, and earth patterns provided at both ends of the circuit board 43 are connected to the metal case 41 by means of soldering. Herein, it is necessary to consider a path with good heat conductivity between the semiconductor circuit element generating heat and the metal case 41.

If the semiconductor circuit element is mounted on the circuit board 43, in general, a path therefor must release heat while establishing face-bonding with the metal case 41 from the external resin of the semiconductor circuit element. If such a semiconductor circuit element is a semiconductor chip, a metal plate such as a heat spreader is bonded to the semiconductor chip and, then, both the metal plate and the semiconductor chip are sealed with a resin. In the conventional example 1, in consideration of a case that the semiconductor chip is directly mounted on the metal case 41, the circuit board 43 has a hollow 44 where a connection between the semiconductor chip and the circuit board 43 becomes possible.

According to the conventional example 1, as described above, face-to-face connection is established between the semiconductor chip and the metal case 41; thus, it is possible to provide a path with excellent heatsinking property capable of transferring heat generated from the semiconductor chip to the metal case 41 establishing face-to-face connection with the semiconductor chip and, then, releasing the heat to the outside of the metal case 41. Therefore, it is possible to obtain a semiconductor module having a shield effect, wherein a semiconductor chip has a temperature suppressed within an operating temperature range.

As compared with the embodiment of the present invention, however, the conventional example 1 has the following disadvantages. That is, the circuit board 43 must be connected to the lead terminal 42 and, also, connected to the metal case 41 by means of soldering. In addition, a resin must be used if a semiconductor circuit element is mounted on a bare chip. Consequently, a manufacturing method becomes complicated. Further, there is no consideration about positioning of a semiconductor chip.

Next, description will be given of the technique in the conventional example 2 again with reference to FIGS. 5A (a front view), 5B (a horizontal sectional view) and 5C (a rear view).

A circuit board 53 having surface mount components 56 mounted thereon, and a semiconductor chip 52 are bonded to a lead frame 51 serving as a heatsink. Next, the semiconductor chip 52, the circuit board 53, and the lead frame 51 serving as a heatsink are electrically connected to each other through conductors 54. Finally, these elements are subjected to transfer seal with an epoxy resin 57. Thus, it is possible to obtain an inexpensive semiconductor module wherein the semiconductor chip 52 has a temperature suppressed within an operating temperature range.

As compared with the embodiment of the present invention, however, the comparative example 2 has the following disadvantages. That is, a conductor to be used for connection of the semiconductor chip 52 herein becomes disadvantageously long in length. In addition, if a plurality of conductors are used, intersection therebetween inevitably occurs, resulting in instable manufacturing method. Further, upon performance of transfer seal with a resin, it is assumed that the resin enters a clearance between the circuit board 53 and the lead frame 51 or a void is formed between the circuit board 53 and the lead frame 51. Consequently, local stress balance is lost, and there is a possibility that reliability as a product deteriorates.

The embodiment of the present invention makes it possible to solve the problems in the conventional examples 1 and 2, and to realize a semiconductor module by a stable manufacturing method. In this manufacturing method, a material capable of reducing a bonding temperature is used, and a semiconductor module is manufactured in accordance with a procedure shown in FIG. 8 (a flowchart); thus, the object of the present invention can be achieved.

Next, description will be given of the manufacturing method of the semiconductor module according to the embodiment with reference to FIG. 8.

Figure 8:
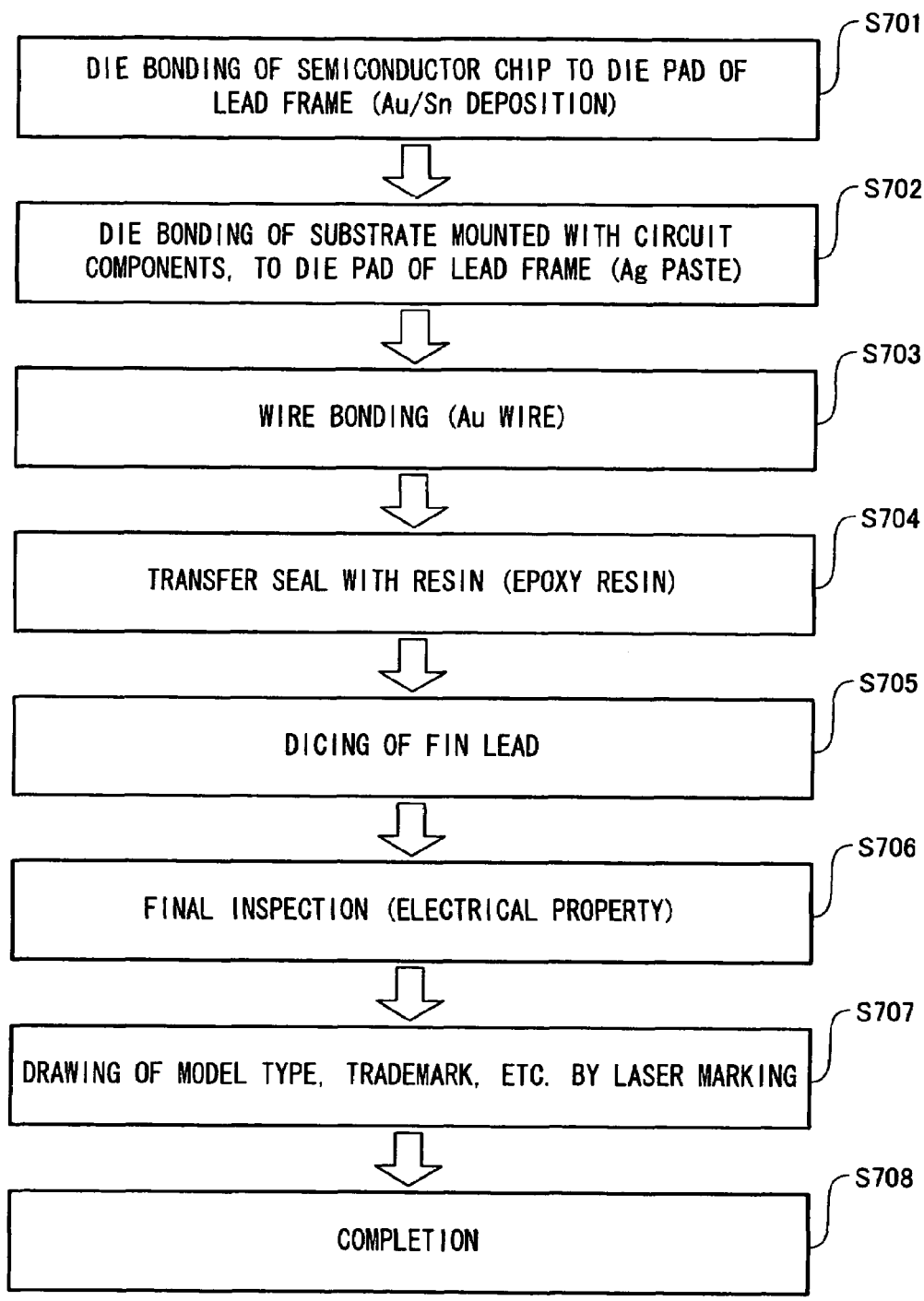
FIG. 8 is a flowchart showing a manufacturing procedure of the semiconductor module according to the embodiment.

As shown in FIG. 8, the manufacturing procedure of the semiconductor module according to the embodiment is as follows. First, the bottom face of the semiconductor chip 12 is previously subjected to Au/Sn deposition in a thickness of about 20 μm. The semiconductor chip 12 is temporally placed on the die pad 17 of the lead frame LF1 subjected to Ag plating, through use of a die bonding machine. Then, the semiconductor chip 12 and the die pad 17 are thermally bonded to each other by Au/Sn in a fixed drying furnace (Step S701). Next, an Ag paste is applied onto the die pad 17 of the lead flame LF1 through use of a dispenser and, then, the substrate 13 having circuit components mounted thereon is die bonded to the die pad 17 of the lead frame LF1 in a curing furnace at 170° C. for one hour (Step S702). Next, the semiconductor chip 12 is wire bonded to the substrate 13 through use of Au wires each having a diameter of 30 μm in a heater block heated to 150° C. and, similarly, the substrate 13 is wire bonded to the inner lead terminals 15 (Step S703). Next, the die pad 17 of the lead frame LF1 is subjected to transfer seal with an epoxy resin and, then, the epoxy resin is cured at 180° C. for 10 hours (Step S704). Next, a fin lead is diced into plural pieces each having a predetermined shape (Step S705). Next, a semiconductor module thus obtained as a product is subjected to a final inspection regarding its electrical property (Step S706). Next, a model type, a trademark, and the like are drawn on an outer face of the semiconductor module by laser marking (Step S707). Thus, a semiconductor module is completed as a product (Step S708).

What is claimed is:

1. A semiconductor module comprising:
   a heatsink,
   a substrate mounted to said heatsink via an adhesive, the substrate having a peripheral circuit component mount face and a hollowed center,
   a semiconductor chip mounted to said heatsink via said adhesive, the semiconductor chip located in the hollowed center of the substrate,
   peripheral circuit components mounted on the substrate and connected to said semiconductor chip via connecting wires, the peripheral circuit components surrounding the semiconductor chip in proximity thereto, and
   resin sealing the substrate, the semiconductor chip, the peripheral circuit components, and the connecting wires into one package,
   wherein the hollowed center of the substrate is of a sufficient size to fit a semiconductor chip and the connecting wires, and
   wherein a dam is located on a bottom surface of the substrate adjacent to the heatsink, the dam located around only an inner periphery of the bottom surface to prevent outflow of the adhesive toward the hollowed center when the substrate is bonded to the heatsink.

2. The semiconductor module according to claim 1, wherein a groove is located in a bottom surface of the substrate adjacent to the heatsink around an outer periphery of the bottom surface to prevent outflow of the adhesive when the substrate is bonded to the heatsink.

3. A semiconductor module comprising:
   a heatsink,
   a substrate mounted to said heatsink via an adhesive, the substrate having a peripheral circuit component mount face and a hollowed center,
   a semiconductor chip mounted to said heatsink via said adhesive, the semiconductor chip located in the hollowed center of the substrate,
   peripheral circuit components mounted on the substrate and connected to said semiconductor chip via connecting wires, the peripheral circuit components surrounding the semiconductor chip in proximity thereto, and
   resin sealing the substrate, the semiconductor chip, the peripheral circuit components, and the connecting wires into one package,
   wherein the hollowed center of the substrate is of a sufficient size to fit a semiconductor chip and the connecting wires, and
   wherein a dam is located on a surface of the heatsink adjacent to the substrate to prevent outflow of the adhesive when the substrate is bonded to the heatsink, the surface corresponding only to an area directly beneath an outer peripheral edge of the substrate.

4. The semiconductor module according to claim 1, wherein a groove is located in a surface of the heatsink beneath only an outer peripheral edge of the substrate to prevent outflow of the adhesive when the substrate is bonded to the heatsink.

5. The semiconductor module according to claim 1, wherein the adhesive is a solid adhesive, and the solid adhesive contains a material for establishing electrical connection in accordance with a shape of the substrate.

6. A method of manufacturing the semiconductor module according to claim 1, wherein a chip positioning jig positions the semiconductor chip within the hollow and a thermal bonding process is used when the semiconductor chip is fixedly bonded to a predetermined position of the heatsink.

7. A method of manufacturing the semiconductor module according to claim 1, wherein the substrate is bonded to the heatsink at a temperature lower than a temperature at which the semiconductor chip is mounted on the heatsink and the peripheral circuit components are mounted on the substrate.

8. The semiconductor module according to claim 1, wherein the dam comprises adhesive tape affixed to the bottom surface of the substrate.

9. The semiconductor module according to claim 3, wherein the dam comprises adhesive tape affixed to the surface of the heatsink adjacent to the substrate.

10. The semiconductor module according to claim 1, wherein the adhesive is a conductive adhesive, and the dam prevents the adhesive from flowing out of a predetermined position.

11. The semiconductor module according to claim 3, wherein the adhesive is a conductive adhesive, and the dam prevents the adhesive from flowing out of a predetermined position.

12. The semiconductor module according to claim 3, wherein a groove is located in a bottom surface of the substrate adjacent to the heatsink around only an inner periphery of the bottom surface, said groove for preventing outflow of the adhesive into the hollowed center of the substrate when the substrate is bonded to the heatsink.

13. The semiconductor module according to claim 3, wherein a groove is located in a surface of the heatsink beneath only an inner peripheral edge of the substrate, said groove for preventing outflow of the adhesive into the hollowed center of the substrate when the substrate is bonded to the heatsink.

14. The semiconductor module according to claim 3, wherein the adhesive is a solid adhesive, and the solid adhesive contains a material for establishing electrical connection in accordance with a shape of the substrate.

15. A method of manufacturing the semiconductor module according to claim 3, comprising:
    positioning the semiconductor chip within the hollow with a chip-positioning jig, and
    fixedly bonding the semiconductor chip to a predetermined position on the heatsink via thermal bonding.

16. A method of manufacturing the semiconductor module according to claim 3, comprising:
    bonding the substrate to the heatsink at a temperature lower than a temperature at which the semiconductor chip is mounted to the heat sink and the peripheral circuit components are mounted on the substrate.

* * * * *